United States Patent
Dorner et al.

(10) Patent No.: US 9,417,267 B2
(45) Date of Patent: Aug. 16, 2016

(54) INTEGRATED OPTICAL CIRCUIT AND METHOD FOR MEASURING CURRENT AS WELL AS SENSOR MODULE AND MEASURING DEVICE

(71) Applicants: Georg Dorner, Bad Krozingen (DE); Sven Voigt, Freiburg (DE); Christian Koos, Siegelsbach (DE); Wolfgang Freude, Karlsruhe (DE); Juerg Leuthold, Walzbachtal (DE)

(72) Inventors: Georg Dorner, Bad Krozingen (DE); Sven Voigt, Freiburg (DE); Christian Koos, Siegelsbach (DE); Wolfgang Freude, Karlsruhe (DE); Juerg Leuthold, Walzbachtal (DE)

(73) Assignee: Northrop Grumman Litef GmbH (DE)

( * ) Notice: Subject to any disclaimer, the term of this patent is extended or adjusted under 35 U.S.C. 154(b) by 470 days.

(21) Appl. No.: 13/815,204

(22) Filed: Feb. 8, 2013

(65) Prior Publication Data

US 2013/0234698 A1 Sep. 12, 2013

(30) Foreign Application Priority Data

Feb. 15, 2012 (DE) .......................... 10 2012 002 984

(51) Int. Cl.
*G01R 31/00* (2006.01)
*G01R 15/24* (2006.01)

(52) U.S. Cl.
CPC .................................. *G01R 15/246* (2013.01)

(58) Field of Classification Search
CPC .. G02F 1/01; G02B 6/12007; G02B 6/29341; G01R 15/246

USPC ............................................................ 324/96
See application file for complete search history.

(56) References Cited

U.S. PATENT DOCUMENTS

| | | | | |
|---|---|---|---|---|
| 5,343,036 A | * | 8/1994 | Bohnert | 250/227.19 |
| 6,136,632 A | * | 10/2000 | Higashi | 438/166 |
| 6,636,321 B2 | * | 10/2003 | Bohnert | 356/483 |
| 7,075,286 B2 | * | 7/2006 | Bohnert | 324/96 |
| 7,257,283 B1 | * | 8/2007 | Liu | G02B 6/12004 385/14 |
| 7,378,861 B1 | * | 5/2008 | Malendevich et al. | 324/750.23 |
| 2004/0017215 A1 | * | 1/2004 | Mule et al. | 324/754 |
| 2007/0222460 A1 | * | 9/2007 | Price et al. | 324/644 |
| 2012/0121216 A1 | * | 5/2012 | Oh | 385/1 |

FOREIGN PATENT DOCUMENTS

| | | |
|---|---|---|
| DE | 38 01 272 A1 | 7/1989 |
| DE | 693 14 986 T2 | 10/1993 |
| DE | 100 21 669 A1 | 11/2001 |

* cited by examiner

*Primary Examiner* — Tung X Nguyen
(74) *Attorney, Agent, or Firm* — Tarolli, Sundheim, Covell & Tummino LLP

(57) ABSTRACT

In an integrated optical circuit, light from a light source is polarized and coupled to a first and second strip waveguide. A waveguide coupling element couples the two optical signals from the two strip waveguides to different polarization modes of an optical fiber line. The optical fiber line is connected to a measuring head, which reflects the optical signal and in which a phase difference between the two optical partial signals is modulated in a magnetic field. In the waveguide coupling element, the reflected signal is split into two optical partial signals having the same polarization and the phase difference between the two partial signals is determined. A phase modulator device provides for closed-loop operation. Compared to fiber-optical concepts, the number of splices is reduced.

20 Claims, 9 Drawing Sheets

INTEGRATED OPTICAL CIRCUIT AND METHOD FOR MEASURING CURRENT AS WELL AS SENSOR MODULE AND MEASURING DEVICE

BACKGROUND

1. Field of the Invention

The present invention relates to an integrated optical circuit for measuring current based on the Faraday effect, a sensor module comprising such an integrated optical circuit and a measuring device. It further relates to a method for measuring current by an integrated optical circuit.

2. Description of the Prior Art

Fiber-optical current sensors (FOCS) detect the current through a conductor by means of an optical fiber wound around the conductor. The magnetic field surrounding the conductor rotates the oscillation plane of linearly polarized light or causes a phase shift between circular polarization modes, orthogonal to one another, of a light beam, guided through the optical fiber. The amount of the phase shift between the polarization modes caused by the electric current is a measure of the intensity of current in the conductor.

In a fiber-optical current sensor, a light beam generated by a light source is guided to a polarizer via a directional coupler and linearly polarized by the polarizer. The polarized light is coupled at 45 degrees with respect to the polarization axes of a polarization maintaining fiber by a fiber splice so that two different polarization modes comprising approximately the same amplitude are guided in parallel in the same fiber. The two polarization modes are "partial light beams" of a primary light beam. They are guided in parallel, comprising a defined polarization and in each case use another optical light path in the polarization maintaining fiber. The two polarization modes pass through a twin refraction phase modulator, which adjusts a non-reciprocal phase shift between the two polarization modes. A $\lambda/4$ phase shifter converts the linearly polarized light into circularly polarized light, to enhance the Faraday effect. The light then passes through a fiber coil, which winds around the conductor carrying the current to be measured, and is reflected in a reflector. When a current flows in the conductor, the Faraday effect between the two circularly polarized polarization modes causes a phase shift whose value is proportional to the current in the conductor. The returning polarization modes are brought together at the fiber splice and guided via the polarizer and the directional coupler to a detector, on which the two polarization modes interfere. The phase shift is reflected in a shift of the interference pattern, which is evaluated.

SUMMARY AND OBJECTS OF THE INVENTION

It is an object of the present invention to provide a measuring arrangement for measuring current based on the Faraday effect, which can be produced in a cost-efficient manner.

The invention addresses the preceding object and others by providing, in a first aspect, an integrated optical circuit for measuring current on the basis of the Faraday effect.

The circuit comprises at least one optical module that encompasses first and second strip waveguides, a waveguide coupling element suitable for coupling a first optical signal from the first strip waveguide and a second optical signal from the second strip waveguide to an optical fiber line so that the same polarization modes of the first and second optical signal are coupled to different polarization modes of the optical fiber line while optical signals from the optical fiber line are coupled to the first and second strip waveguide as a function of the polarization mode.

In a second aspect, the invention provides a method for measuring current on the basis of the Faraday effect by an integrated optical circuit. The steps of the method include transmitting a first optical signal via a first strip waveguide and a second optical signal via a second strip waveguide to a waveguide coupling element, with the first and the second optical signal having the same polarization mode.

The first and the second optical signal are coupled to an optical fiber line of a measuring head by a waveguide coupling element wherein the first and the second optical signal are coupled to different polarization modes of the optical fiber line. An optical signal, which is reflected by the measuring head, comprising two partial signals having a different polarization from the optical fiber line is coupled to the first and second strip waveguide in accordance with the polarization mode. A phase difference between the two optical signals, which are coupled on the first and second strip waveguide is detected by means of the optical fiber line.

The foregoing features of the invention will become further apparent from the detailed description that follows. Such description is accompanied by a set of drawing figures. Numerals of the figures, corresponding to those of the written description, point to the features of the invention with like numerals referring to like features of the invention throughout.

DETAILED DESCRIPTION OF THE PREFERRED EMBODIMENT

Figure 1A:
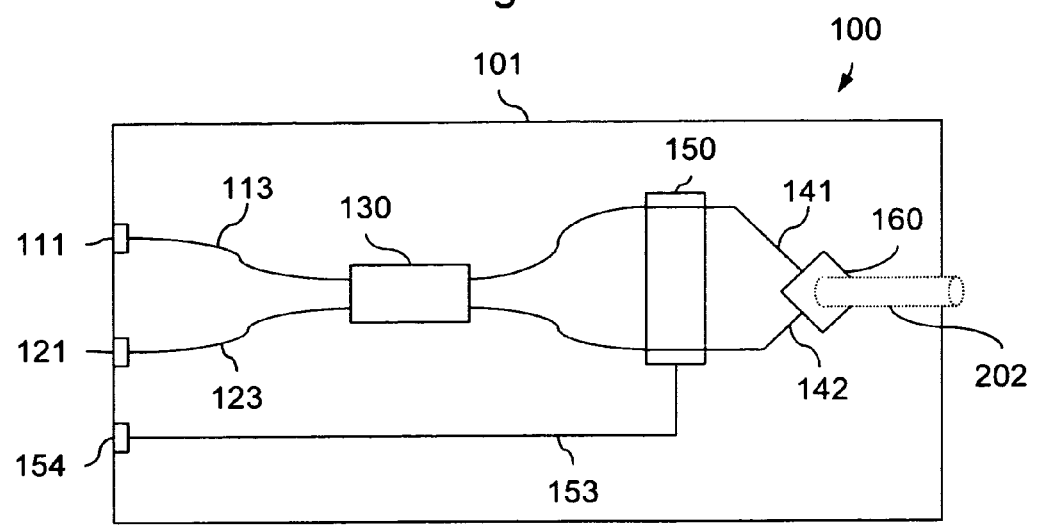
FIG. 1A is a schematic top view of an optical module of an integrated optical circuit.

FIG. 1A is an integrated optical circuit 100 for measuring current based on the Faraday effect. The circuit 100 encompasses one or a plurality of measuring modules 101, each comprising a first strip waveguide 141 and a second strip waveguide 142. According to one embodiment, the material of the strip waveguides 141, 142 is polarization maintaining. In another embodiment, the material of the strip waveguides 141, 142 is a highly anisotropic, polarizing material. For example, the material of the strip waveguides 141, 142 can be a semiconductor material, e.g. GaAs or silicon.

The strip waveguides 141, 142 can in each case be embodied completely or partially as supported waveguides that rest on a substrate comprising a lower refractive index, as buried strip waveguides integrated into a substrate comprising a lower refractive index, as slotted waveguide or as nano rib waveguide. The underlying substrate of the strip waveguides 141, 142 is, for example, monocrystalline silicon, silicon dioxide or glass. The width of the strip waveguides 141, 142 is 100 micrometers or less. According to an embodiment, their widths are between equal to or less than the wavelength of the light guided in them. For example, the width of the strip waveguides 141, 142 is maximally 1 micrometer or 300 nm, at least in sections.

The integrated optical circuit 100 further includes a waveguide coupling element 160. It couples the light signal, which is brought close via the first strip waveguide 141 as well as via the second strip waveguide 142, to an optical fiber line 202. The waveguide coupling element 160 thereby couples the two light signals to different polarization modes of the optical fiber line 202. Vice versa, it couples two orthogonal polarization modes of a light beam, which is brought close via the optical fiber line 202, onto either the first strip waveguide 141 or the second strip waveguide 142 as a function of polarization direction. For example, the waveguide coupling element 160 is a decoupling grid and a front surface of the optical fiber line 202 is arranged above the decoupling grid, to be oriented substantially parallel to the grid surface. For example, the decoupling grid couples the two optical signals, which are brought close via the two strip waveguides 141, 142, into orthogonal linear polarization states of the optical fiber line 202. For example, the decoupling grid is a two-dimensional grid in an overlapping area of the first and of the second strip waveguide 141, 142.

The dimensions of the decoupling grid can be adapted to the cross section of the fiber line. For example, the decoupling grid can comprise a surface of less than 1 mm². The edge length can be between several 10 and several 100 micrometers. The two strip waveguides 141, 142 intersect one another, for example in the decoupling grid, at an angle of 90 degrees. In a transition section, the width of the strip waveguides 141, 142 can thereby be adapted to the edge length of the decoupling grid either steadily or linearly, based on a width of several ten or hundred nanometers. According to an embodiment, the grid is etched into a silicon layer, which has a thickness of several 10 to several 100 nm that rests on a SiO₂ layer. For example, the grid comprises a regular field of depressions comprising a depth of 90 nm and a diameter of the depressions of approximately 300 nm with a grid period of 580 nm.

The integrated optical circuit 100 further comprises a phase modulator device 150, via which a phase difference between the two light signals having the same polarization in the first and in the second strip waveguide 141, 142 can be controlled. To control the phase modulator device 150, the optical module 101 encompasses one or a plurality of electric lines 153 that are guided between an electric interface 154 of the optical module 101 and the phase modulator device 150.

A directional coupling element 130 branches the two optical light signals, which are guided to the to the optical fiber line 202 via the two strip waveguides 141, 142, from a common optical input signal and further guides the two optical partial signals, which are received by the optical fiber line 202, together to a common output signal. A further strip waveguide 113 connects the directional coupling element 130 to an input gate 111, via which the optical input signal is coupled into the optical module 101. The optical output signal is output via an output gate 121, which is connected to the directional coupling element 130 via a further strip waveguide 123.

The phase modulator device 150 can be an electro-optical phase modulator of the push-pull type, for example. According to an embodiment, the phase modulator device 150 comprises exactly one modulator unit in each of the two optical signal paths comprising the first and second strip waveguides 141, 142. Due to the fact that the phase modulator device 150 finally only adjusts the phase difference between the two optical signals in the two optical signal paths, which are defined by the first and second strip wave conductor 141, 142, the phase modulator device 150 comprises exactly one modulator unit in one of the two optical signal paths in another embodiment. Each modulator unit can consist of one piece. According to an embodiment, at least one of the modulator units is segmented, wherein the segments can be controlled independent from one another. For example, one of the segments can be used to adjust a fixed phase offset and thus a certain operating point, while a further segment mainly or exclusively serves for high-frequency modulation of the measuring signal. According to an embodiment, a plurality of segments of a modulator unit is embodied in the form of a digital phase modulator (optical DA converter).

For example, the directional coupling element 130 is an integrated optical 2:2 directional coupler comprising a phase difference of 90° between the two optical signals on the output side. The directional coupling element 130 feeds an optical input signal on a first gate of a first gate pair to a first or second gate of a second gate pair and feeds optical signals at the gates of the second gate pair to the second gate of the first gate pair. In the optical module 101, the directional coupling element 130 guides an optical input signal, which is fed at the input gate 111, to the first and second strip waveguide 141, 142. In addition, the directional coupling element 130 couples the optical partial signals, which are received by the optical fiber line 202 and which are coupled to the first and second strip waveguides 141, 142, to the strip waveguide 123, which is connected to the output gate 121 of the optical module 101.

A first optical signal path comprising the first strip waveguide 141 between the first gate of the second gate pair of the directional coupling element 130 and the waveguide coupling element 160 covers a different optical distance than the second optical signal path comprising the second strip waveguide 142 between the second gate of the second gate pair of the directional coupling element 130 and the waveguide coupling element 160. The optical path difference has the effect that an interference contrast of the optical signals in the waveguide coupling element 160 as compared to an imaginary embodiment comprising identical distances is reduced by at least 50%, for example 90% of more or is almost 0. The optical path difference follows from the bandwidth of the optical signal and the effective refractive index of the strip waveguide. According to an exemplary embodiment for a Si waveguide comprising an effective refractive index of approximately 3 and a wavelength difference Δλ of 30 nm with a significant wavelength of 1500 nm, the optical path difference is approximately 100 μm.

The number of necessary fiber splices and, thus, the number of potential polarization cross coupling points, which can lead to inaccuracies in the sensor, can be reduced considerably with the integrated optical circuit 100. In addition, the integrated optical circuit 100 can be produced in a comparatively simple manner.

Figure 1B:
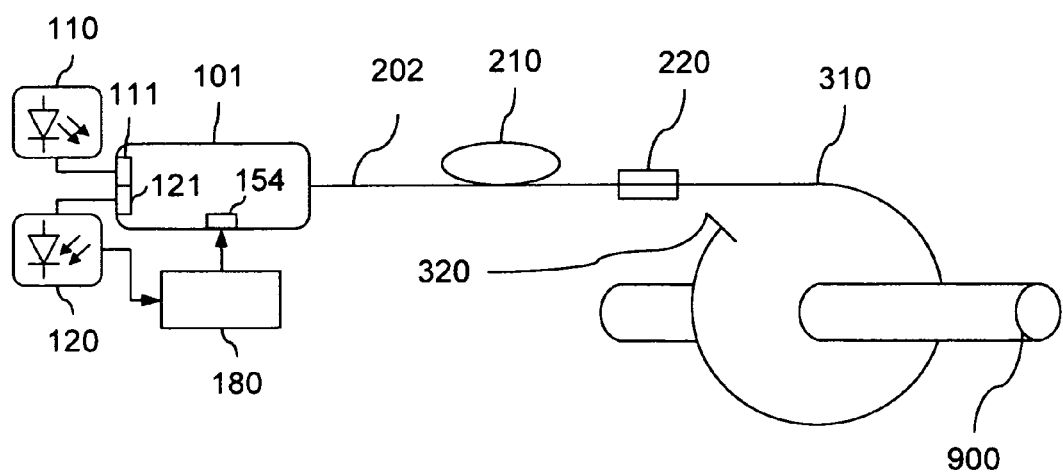
FIG. 1B is a schematic illustration of a device for measuring a current based on the Faraday effect by an integrated optical circuit comprising the optical module of to FIG. 1A.

FIG. 1B shows a device for magnetic field measuring or for measuring a current through a line 900, respectively, by means of the described integrated optical circuit comprising an optical module 101. Light from a light source 110 is fed into an integrated optical circuit comprising an optical module 101 via the input gate 111. The light is polarized in the optical circuit and coupled to two optical signal paths having different distances. The two partial signals are coupled to different polarization modes of an optical fiber line 202 by the two optical signal paths. Accordingly, the optical fiber line 202 guides an optical signal consisting of two partial signals comprising a different linear polarization and phase. The two polarization modes run via a delay element 210 to a quarter-wavelength plate 220, which converts the two linearly polarized light waves into a left and a right circularly polarized light wave. The optical signal then passes through an optical fiber coil 310, which wraps around a live conductor 900. A reflector 320 at the end of the fiber coil 310 reflects the optical signal. The two circular polarization modes of the reflected signal are converted again into linearly polarized polarization modes in the quarter-wave length plate 220 and are coupled into the optical module 101 via the optical fiber line 202. From the two polarization modes, the optical module 101 creates two optical partial signals having the same polarization mode, combines them and guides the combination signal comprising the two optical partial signals to a detector element 120 that is coupled to the output gate 121 of the optical module 101. The detector element 126 registers the phase difference between the two optical partial signals. An evaluation and control unit 180 evaluates a phase difference between the two partial signals to control a phase modulation device in the optical module 101 via an electric interface 154 such that the phase difference between the two optical partial signals does not deviate from a predetermined value.

Figure 2A:
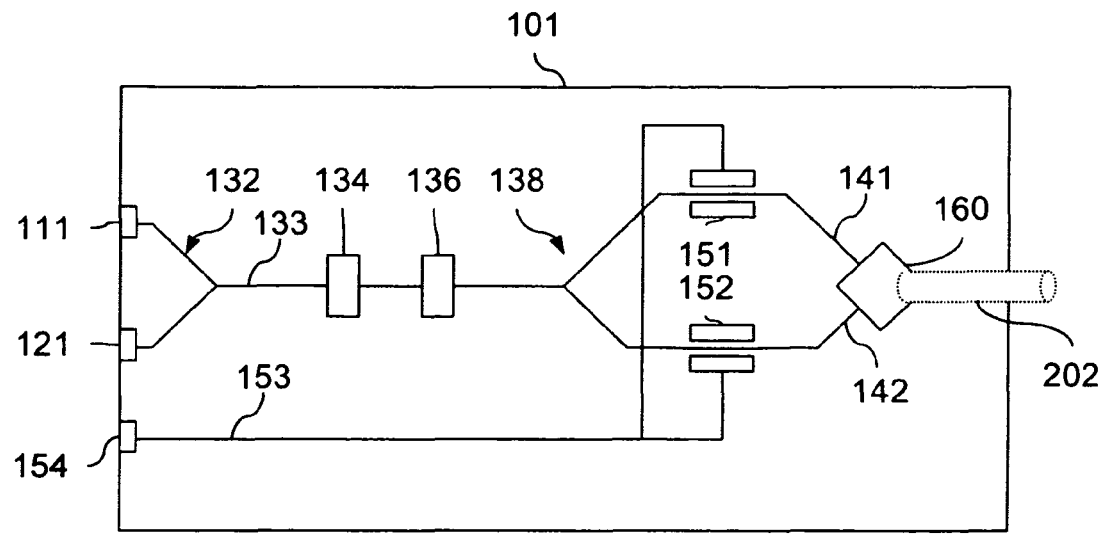
FIG. 2A is a schematic top view of an integrated optical circuit comprising an optical module according to an embodiment of the invention comprising waveguide combining and waveguide branching elements.

FIG. 2A refers to an embodiment, in which the directional coupling element comprises a waveguide combining element 132 and a waveguide branching element 138. The waveguide combining element 132 guides optical signals at the first and second gate of the first gate pair to a third strip waveguide 133 and an optical signal from the third strip waveguide 133 to the second gate of the first gate pair. The waveguide branching element 138 couples the signal from the third strip waveguide 133 in equal parts to the first and second optical signal path comprising the first and second strip waveguides 141, 142 or couples the optical partial signals received by the optical fiber line 202 from the first and second optical signal path to the third strip waveguide 133, respectively. For example, the waveguide combining element 132 as well as the waveguide branching element 138 is Y-like strip structures in the technology of the strip waveguides 141, 142, 133 that are provided in the optical module 101.

According to an embodiment based on polarization maintaining strip waveguides and in response to feeding non-polarized light into the optical module 101, the directional coupling element can encompass a polarization element 134 that polarizes light linearly. According to an embodiment, the polarization element 134 is an integrated optical polarizer (e.g. of the Plasmon type) wherein provision is made via a silicon nano-waveguide for a thin layer system consisting of at least one dielectric layer and a metal layer. By exciting a Plasmon in the metal layer, a polarization mode guided in the silicon nano-waveguide is quasi absorbed. According to anther embodiment, the polarization element 134 is a hybrid-integrated polarizer, for instance a thin layer polarizer, for example a glass polarizer comprising a thickness of between 10 and several 100 μm, which is arranged in a trench etched into the substrate, e.g. a silicon substrate. In the event that polarized light is already fed into the optical module 101 or the strip waveguides are themselves polarizing, the polarization element 134 is no longer necessary. For example, integrated silicon nano-waveguides encompass a high polarization dependency, that is, the two linearly polarized individual modes have highly different expansion constants so that the polarization states are highly decoupled from one another. For example, the silicon nano-waveguides can be designed such that only one of the two linearly polarized individual modes are capable of expanding at all, so that the integrated silicon nano-waveguide itself acts as polarizer. The polarizing effect of the silicon nano-waveguide or the polarization element 134, respectively, insure that only a linear polarization is guided and modulated in the interferometer.

The optical module 101 can encompass a spatial filter element 136, which is arranged in the optical path between the waveguide combining element 132 and the waveguide branching element 138. The spatial filter element 136 suppresses non-reciprocal optical paths that are created in the otherwise-reciprocal integrated optical interferometer by exciting a second or higher waveguide mode. Such a second waveguide mode can be excited, for example, in the waveguide branching element 138. In response to a conventional fiber-optical realization of the interferometer, the corresponding optical fiber encompasses a minimum length, in the case of which such a higher mode emits completely. In response to the realization in an integrated optical circuit, however, the length of the corresponding section of the strip waveguide is not sufficient. Rather, an embodiment provides a spatial filter element 136 between the waveguide combining element 132 and the waveguide branching element 138.

In the illustrated embodiment, the optical module 101 encompasses a first modulator unit 151, which is effective in a first optical path comprising the first strip waveguide 141, and a second modulator unit 152, which is effective in a second optical path comprising the second strip waveguide 142.

Figure 2B:
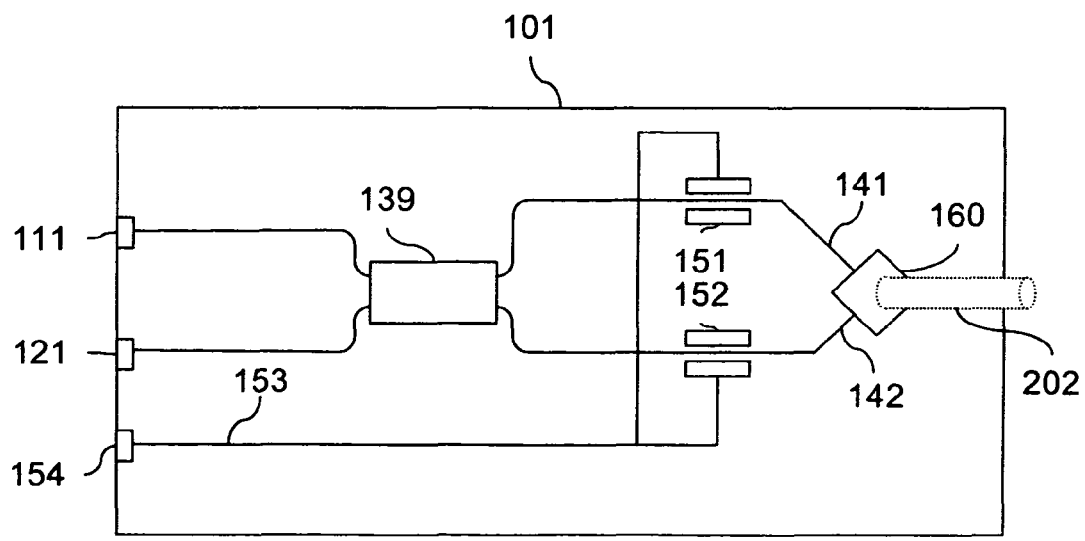
FIG. 2B is a schematic top view of an integrated optical circuit according to an embodiment of the invention comprising an optical module including a 2:2 directional coupling element.

FIG. 2B illustrates an embodiment comprising a 2:2 directional coupler 139 as directional coupling element. According to an embodiment, the strip waveguides of the integrated optical circuit 100 are designed such that only one of the two linearly polarized individual modes can expand, as is the case in a highly anisotropic waveguide, for example. The independent modes can be a TE-mode, for example, in which case the electric field is oriented substantially parallel to the substrate plane. Such a solution does not require an integrated optical polarizer. The light, which is emitted by a light source and fed via the input gate 111, is divided onto two arms of an interferometer arrangement by means of the 2:2 directional coupler 139. In the interferometer arrangement, a phase modulator device comprising two module units 151, 152 modulates the phase difference between the optical signals in the two arms. The two optical signals are coupled into orthogonal, linear polarization states of an optical fiber line 202 by a waveguide coupling element 160.

Figure 3:
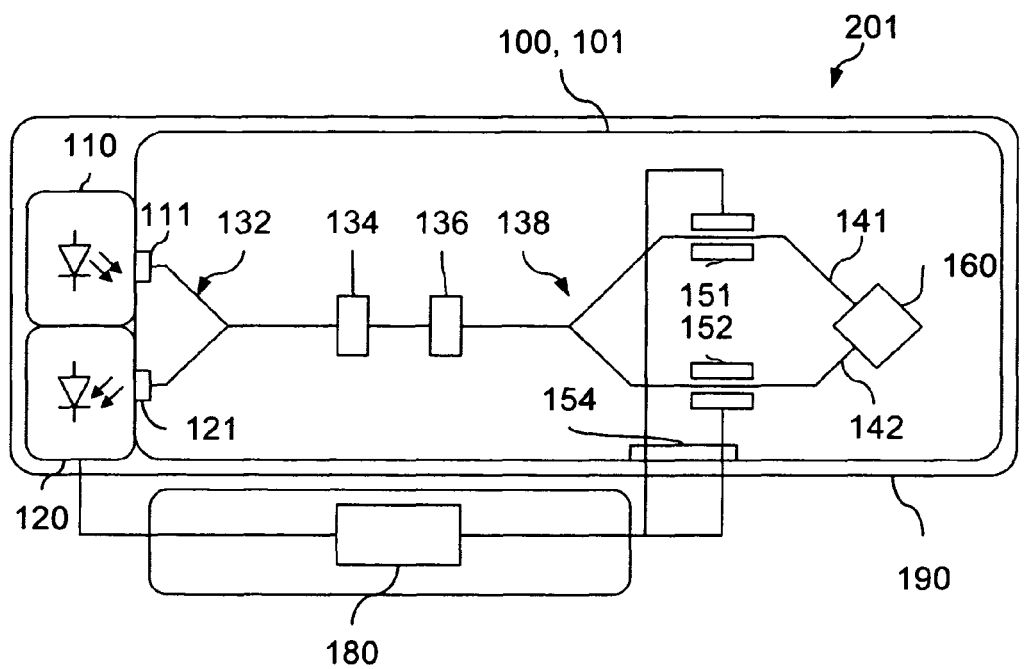
FIG. 3 is a schematic top view of a sensor module comprising an integrated optical circuit, a light source, a detector element and an evaluation and control unit according to a hybrid embodiment.

FIG. 3 illustrates a sensor module 201 comprising an integrated optical circuit 100, which only comprises an optical module 101. The light emitted by a light source 110 is coupled into the optical module 101 of the integrated optical circuit 100 via an input gate 111, guided to a polarization element 134 by means of a waveguide combining element 132, polarized linearly at that location and distributed onto two asymmetrical strip waveguides 141, 142 by means of a waveguide branching element 138, wherein the waveguide branching element 138 can generate a first phase difference between the optical signals guided in the two strip waveguides 141, 142. The two strip waveguides 141, 142 are brought together in a waveguide coupling element 160, which feeds the two optical signals, which are guided in the two strip waveguides 141, 142, into an optical fiber line 202, which is arranged above the waveguide coupling element 160 with a front side. The optical fiber line 202 is connected to a magnetic field-sensitive, fiber-optical sensor head, in which the optical signal, which is coupled into the optical fiber line 202, is reflected, and in which the phase difference between the two polarization modes is changed as a function of the intensity of a magnetic field, to which the sensor head is subjected.

The optical signal reflected in the sensor head comprising the two polarization modes is coupled back to the two strip waveguides 141, 142 via the waveguide coupling element 160, wherein the one polarization mode is substantially coupled into the first strip waveguide 141 and the other polarization mode into the other strip waveguide 142. Due to the fact that the waveguide coupling element 160 acts reciprocally, the change in the polarization direction in the second strip waveguide 142 is thereby reversed again. The two optical partial signals guided in the two strip waveguides 141, 142 thus have the same polarization, but encompass a phase difference to one another, which includes information relating to the intensity of the magnetic field, to which the sensor head is subjected.

The waveguide branching element 138 guides the two optical partial signals together, wherein the spatial filter element 136 filters or emits, respectively, higher modes, which have been excited, e.g. by guiding the optical signals via the waveguide branching element 138. The waveguide combining element 132 couples the two overlapping optical partial signals to an output gate 121 of the optical module 101, to which an optical detector element 120 is coupled. An evaluation and control unit 180 determines the intensity of the magnetic field or that of a current that generates the magnetic field, respectively, from the displacement of an interference pattern that results from the overlap between the two phase-shifted optical partial signals.

According to an embodiment, the sensor module 201 is operated closed-loop, wherein the evaluation and control unit 180 controls a phase modulator device comprising modulator units 151, 152 arranged between the waveguide branching element 138 and the waveguide coupling element 160 so that the phase difference determined in the optical detector element 120 does not deviate from a predetermined reference value. According to an embodiment, the evaluation and control unit 180 outputs electric signals for this purpose that are transmitted to an electric interface of the optical module 101. Electric lines connect the electric interface to the modulator units 151, 152 in the optical module 101.

The light source 110 is a hybrid SLD (super luminescent diode) chip, for example, which is produced separately and optically coupled to the integrated optical circuit 100, for example, by front surface coupling of corresponding waveguide facets or by means of flip-chip assembly. The optical detector element 120, together with the light source 110, can be processed on a common chip and, together with the light source 110, coupled to the integrated optical circuit 100. The location of light source 110 and detector element 120 outside the integrated optical circuit 100 provides use of common light sources and detector elements. According to a further embodiment, only the detector element 120 is integrated on the integrated optical circuit 100, e.g. on the basis of Ge or III-V, while the light source 110 is provided on a separately processed chip. Such embodiment reduces the assembly effort in response to the production, in particular when the integrated optical circuit encompasses a plurality of optical modules that are, in each case, assigned to different detector elements, but can be fed from the same light source.

The evaluation control electronics 180 for data processing can be integrated into the integrated optical circuit and can be embodied on a common substrate together with the strip waveguides and modulators. According to the embodiment shown in FIG. 3, the evaluation and control electronics 180 is realized on a separate silicon chip.

The sensor module 201 further comprises a thermoelectric element 190 (TEC, Peltier element) that is thermally coupled to the integrated optical circuit 100. The thermoelectric element 190 holds the temperature of the integrated optical circuit 100 at a predetermined value. According to an embodiment, the thermoelectric element 190 also holds the temperature of the light source 110 or the temperature of light source 110 and detector element 120, respectively, constant. The thermoelectric element 190 suppresses temperature-dependent polarization cross-couplings. In addition, a resulting phase shift can be held constant and can be calibrated, if necessary, in response to a temperature stabilization of the integrated optical circuit to approximately 0.1° C.

Figure 4:
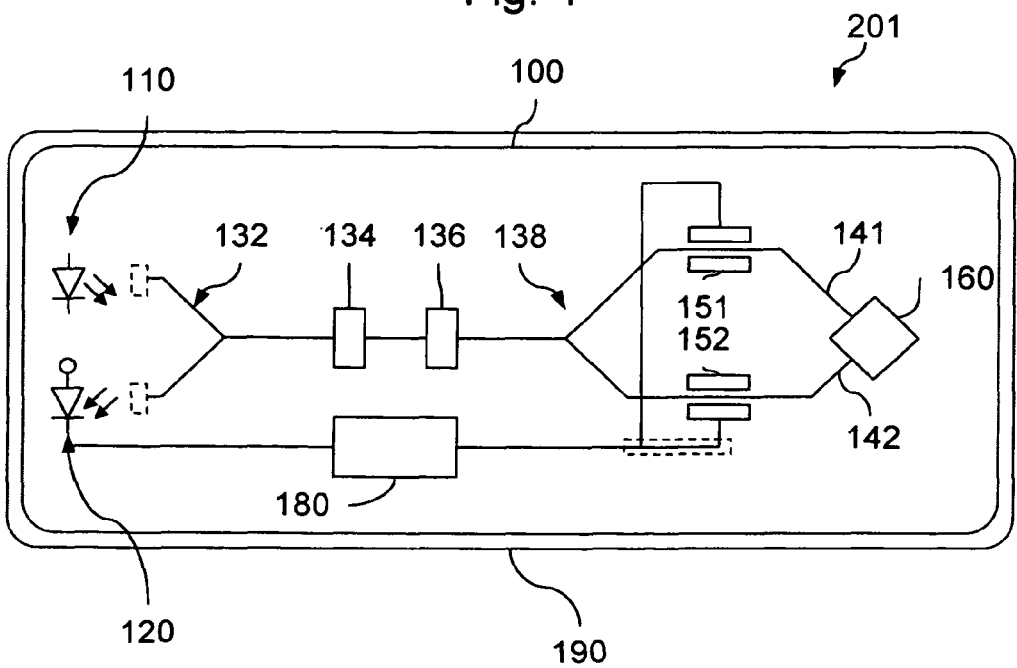
FIG. 4 is a schematic top view of a sensor module comprising an integrated optical circuit, in the case of which light source, detector element and evaluation and control unit are monolithically integrated.

The embodiment illustrated in FIG. 4 shows a monolithically integrated solution, in which the optical module 101, the light source 110, the detector element 120 and the evaluation control unit 180 are embodied on the same substrate and are thermally coupled to a thermoelectric element 190. The "input gate" and the "output gate", respectively, of the optical module are strip waveguides that optically connect the directional coupling element to a light source 110 or a detector element 120, respectively.

FIGS. 5A to 5D refer to embodiments of a spatial filter element 136.

Figure 5A:
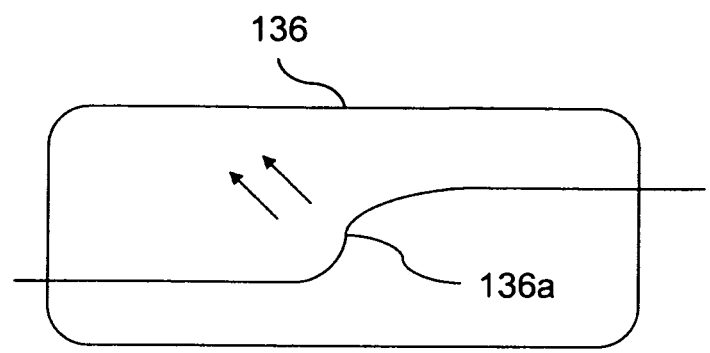
FIG. 5A is a schematic top view of a spatial filter element for an integrated optical circuit according to an embodiment comprising a simple bend.
Figure 5B:
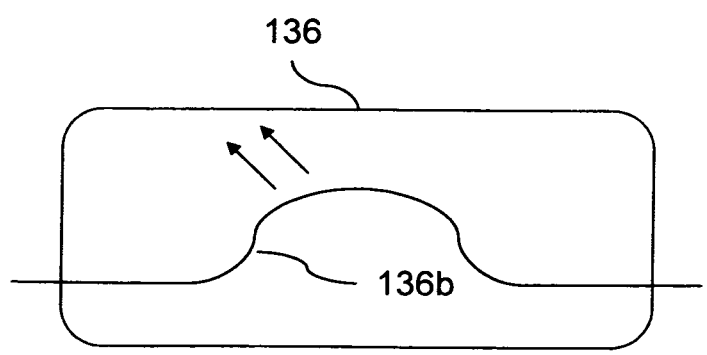
FIG. 5B is a schematic top view of a spatial filter element according to an embodiment comprising a double bend.

In the embodiment according to FIG. 5B, the emission of higher waveguide modes takes place by means of a single curve in the strip waveguide 136a. The strip waveguide 136b comprises a highly curved waveguide section comprising two curves in opposite direction, forming, for example, a semicircle. Such a twice curved waveguide section suppresses the guidance of higher modes.

Figure 5C:
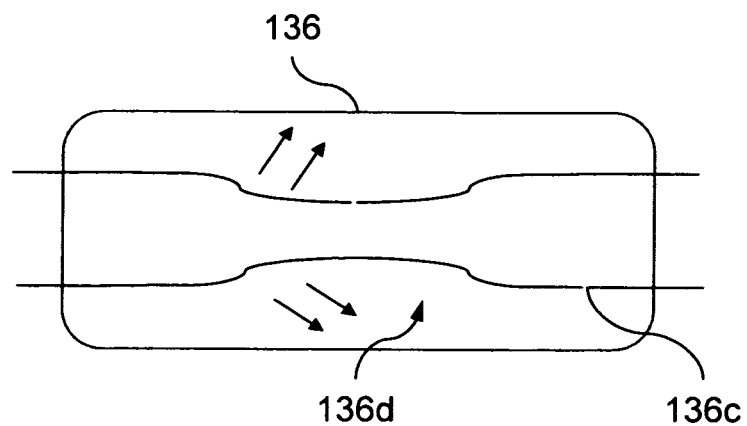
FIG. 5C is a schematic top view of a spatial filter element according to an embodiment comprising a cross section constriction of a strip waveguide.

FIG. 5C refers to an exemplary embodiment, in which a strip waveguide 136c includes a section comprising a constriction 136d. The course of the constriction follows a mathematical function, which allows for the base modes to pass virtually undampened.

Figure 5D:
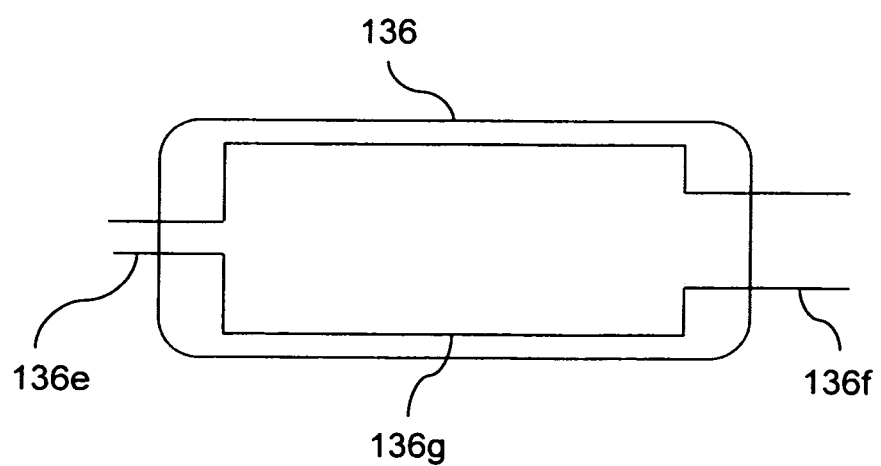
FIG. 5D is a schematic top view of a spatial filter element according to an embodiment comprising different waveguide geometries.

FIG. 5D refers to a spatial filter element 136 comprising a multimode interference area (MMI structure) 136g with different conductor widths for the strip waveguide 136e on the input side and the strip waveguide 136f on the output side.

According to an embodiment, the integrated optical circuit encompasses exactly one of the optical modules 101 comprising a directional coupling element 130, a phase modulator unit 150 and a decoupling element 160. An integrated optical circuit comprising exactly one of such optical modules 101 is suitable for measuring direct current or alternating current in exactly one conductor.

Figure 6:
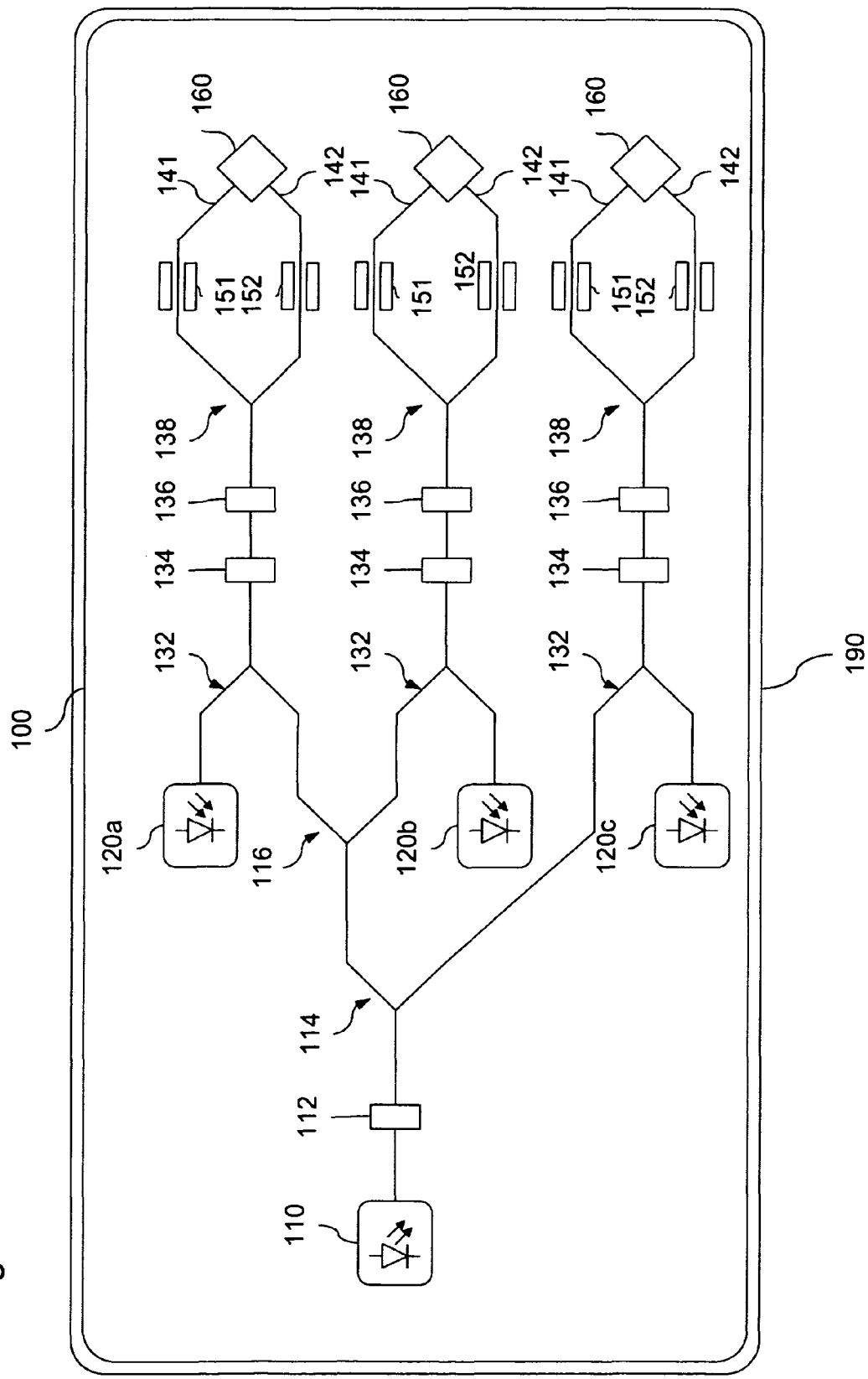
FIG. 6 is a schematic top view of an integrated optical circuit comprising three optical modules for measuring three-phase currents.

According to the embodiment of FIG. 6, the integrated optical circuit 100 comprises three (or more) optical modules with an identical profile. Each optical module comprises a directional coupling element, for example a waveguide combining element 132, a polarization element 134, a spatial filter element 136 and a waveguide branching element 138, as well as a phase modulator unit comprising, for example, a first modulator unit 151 assigned to a first strip waveguide 141, and a second modulator unit 152 assigned to a second strip waveguide 142, as well as a waveguide coupling element 160 for coupling the first and the second strip waveguide 141, 142 to an optical fiber line 202. A detector element 120a, 120b, 120c, which is optically coupled to a respective output gate, is assigned to each output gate of the optical modules 101. In contrast, the input gates of the three optical modules are coupled to the same light source 110 via, for example, a 1:3 waveguide branching element 114/116.

According to an embodiment, provision is made between the light source 110 and the 1:3 waveguide branching element 114/116 for an additional polarization element 112. For example, the 1:3 waveguide branching element 114/116 consists of a first beam splitter 114, which divides an optical input signal at a ratio of 67%:33%, and of a second beam splitter 116, which evenly distributes the 67% output signal of the first beam splitter 114 to the two strip waveguides on the output side. The light source 110 and the detector elements 120a, 120b, 120c can either be monolithically integrated on the same substrate, on which the optical module are also integrated. According to another embodiment, they are processed on separate chips and are optically coupled to the optical module 101.

Figure 7:
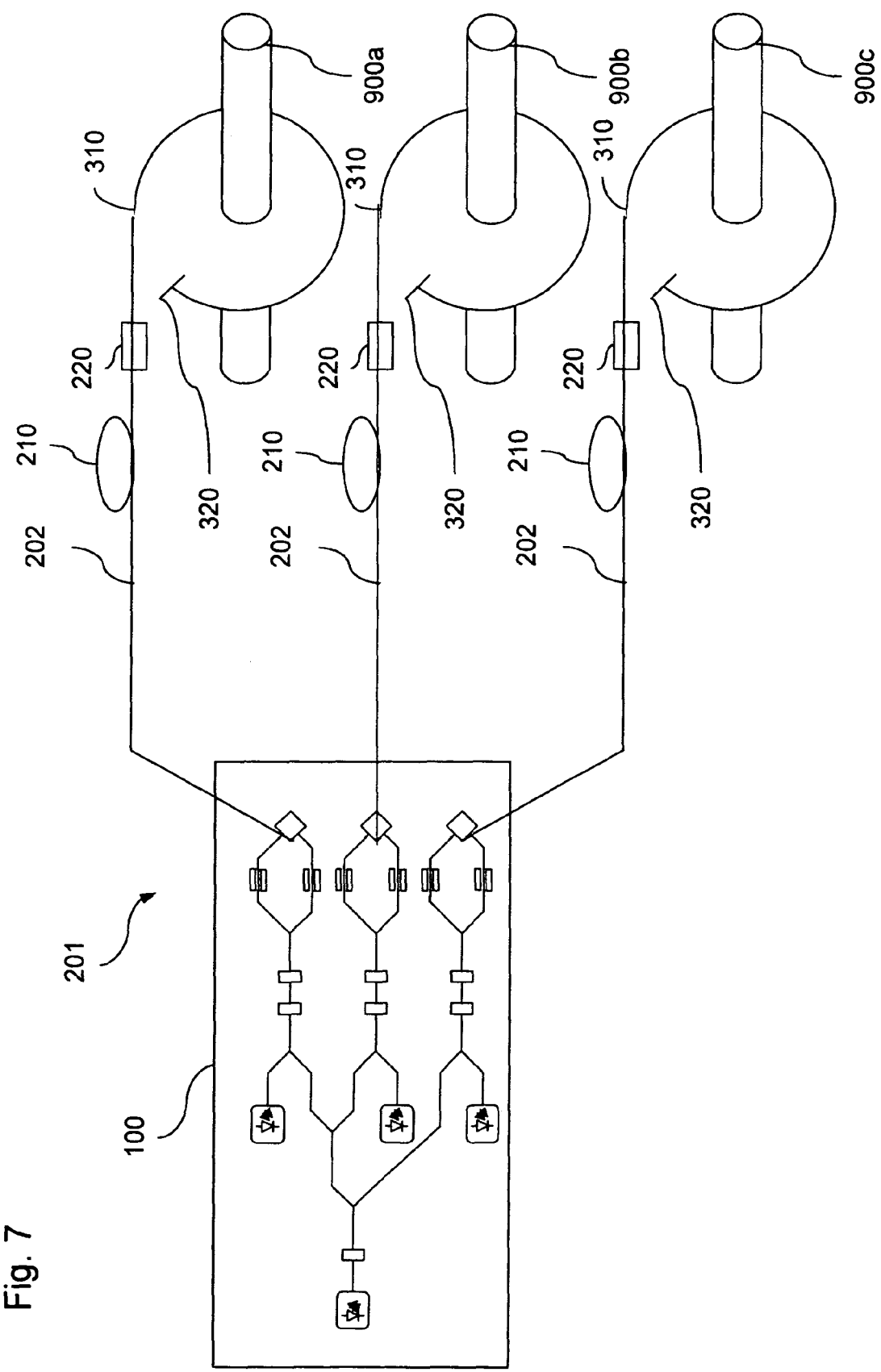
FIG. 7 is a schematic illustration of a measuring device for measuring three-phase currents by means of the integrated optical circuit according to FIG. 6.

FIG. 7 shows an embodiment of a measuring device 201 for measuring in a three-phase system comprising three live conductors 900a, 900b, 900c by means of the integrated optical circuit 100 of FIG. 6. The setup is analogous to the setup shown in FIG. 1B. One of the optical modules of the optical circuit 100 is assigned to each of the live conductors 900a, 900b, 900c.

Figure 8:
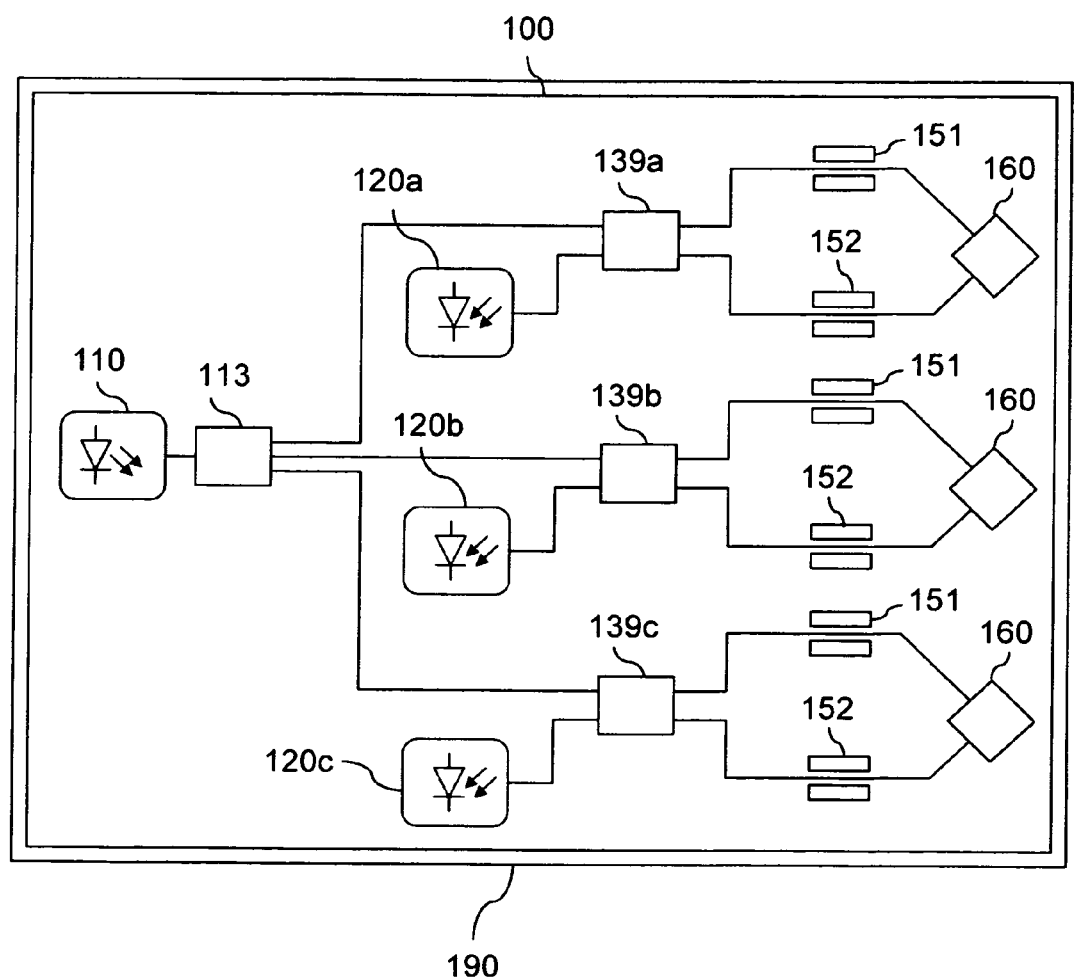
FIG. 8 is a schematic top view of an integrated optical circuit comprising a 1:3 coupler and three 2:2 couplers for measuring three-phase currents.

FIG. 8 refers to a further embodiment for an integrated optical circuit comprising three substantially similar optical modules for measuring currents in three-phase systems. The embodiment is based on a 1:3 divider 113, which distributes the signal of the light source 110 to the three input gates of the three optical modules. All of the strip waveguides are nano-waveguides, for example, in which only one of the two linearly polarized independent modes can expand, so that integrated optical polarizers are not longer necessary. Each of the optical modules encompasses a 2:2 directional coupler 139a, 139b, 139c, which in each case guides an optical signal at a first gate of a first gate pair to a first and a second gate of a second gate pair and optical signals at the gates of the second gate pair to the second gate of the first gate pair. The power divider can be designed as MMI coupler (multi-mode interference coupler). The embodiment avoids waveguide crossings. The light source 110 and the detector elements 120a, 120b, 120c can either be integrated monolithically or produced separately and coupled optically to the optical modules. The integrated optical circuit 100 is thermally coupled to a thermoelectric element, which is controlled such that the integrated optical circuit can be operated with a deviation from the operating temperature of less than 0.1° C.

Figure 9:
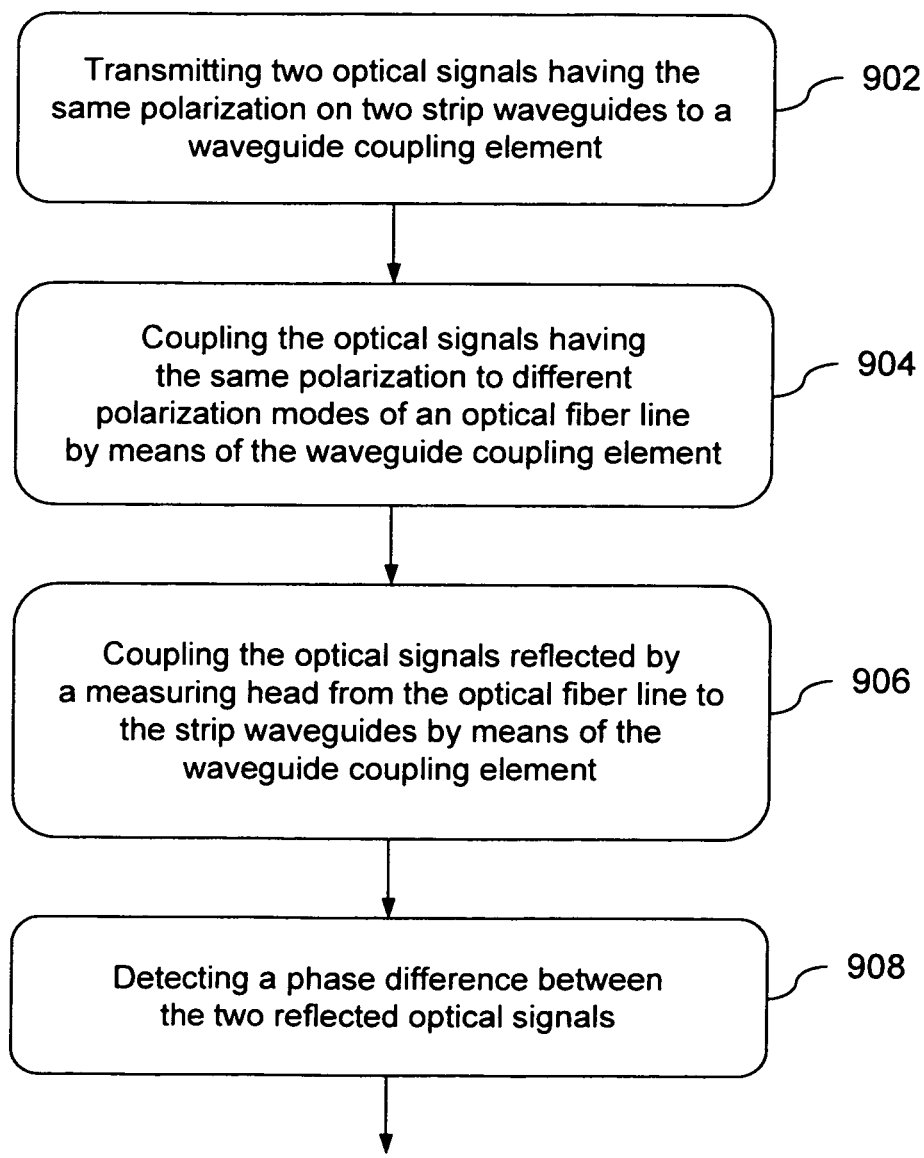
FIG. 9 is a simplified flowchart of a method for operating a measuring device.

FIG. 9 is a flow chart of a method for measuring current on the basis of the Faraday effect by means of an integrated optical circuit. In the integrated optical circuit, a first and a second optical polarized signal are transmitted to a waveguide coupling element (902) via a first or a second strip waveguide, respectively. The first and the second optical signal are coupled to an optical fiber line of a measuring head (904) via the waveguide coupling element, wherein the optical signal, which can be transmitted via the second strip waveguide, is coupled to a different polarization mode of the optical fiber line than the first optical signal. The optical signal, which is reflected by the measuring head, includes two optical partial signals having a different polarization. The first optical partial signal is coupled into the first strip waveguide on the waveguide coupling element and the second optical partial signal is coupled into the second strip waveguide (906), wherein the polarization is rotated reciprocally. The two optical partial signals, which are obtained from the reflected signal, have the same polarization in the two strip waveguides and encompass a phase shift relative to one another that corresponds to the intensity of a magnetic field to which the measuring head is subjected. The phase difference is detected (908) and a conclusion is drawn to the intensity of current from the phase difference.

According to an embodiment, the phase difference between the first and the second optical signal is regulated to a predetermined value by means of a phase modulator.

While the invention is presented with reference to a presently-preferred embodiment, it is not limited thereto. Rather, this invention is limited only insofar as it is described in the following patent claims and includes within its scope all equivalents thereof.

What is claimed is:

1. An integrated optical circuit for measuring current on the basis of the Faraday effect, comprising at least one optical module, which encompasses:
   a first strip waveguide of a semiconductor material;
   a second strip waveguide of the semiconductor material;
   a waveguide coupling element, which is suitable for coupling a first optical signal from the first strip waveguide and a second optical signal from the second strip waveguide to an optical fiber line, wherein the same polarization modes of the first and second optical signal are coupled to different polarization modes of the optical fiber line and optical signals from the optical fiber line are coupled to first and second strip waveguide as a function of the polarization mode;
   a directional coupling element, which is suitable to couple an optical input signal at an input gate to the first and the second strip waveguide and to couple optical signals from the first and second strip waveguide to an output gate;
   a first optical signal path between the directional coupling element and the waveguide coupling element, comprising the first strip waveguide; and
   a second optical signal path between the directional coupling element and the waveguide coupling element, comprising the second strip waveguide, wherein an optical distance of the second optical signal path deviates from that of the first optical signal path, so that an interference contrast of the optical signals in the waveguide coupling element as compared to the identical distance is reduced by at least 50%.

2. The integrated optical circuit according to claim 1, characterized by a controllable phase modulator device, which is suitable to impact a phase between the same polarization modes of the first and of the second optical signal.

3. The integrated optical circuit according to claim 2, characterized in that the phase modulator device comprises exactly one modulator unit, which is assigned to one of the two strip waveguides.

4. The integrated optical circuit according to claim 2, characterized in that the phase modulator device comprises a modulator unit, which acts on the first optical signals, and a second modular unit, which acts on the second optical signal.

5. The integrated optical circuit according to claim 1, characterized in that a difference of the optical distance in the first and second optical signal path is dimensioned such that the interference contrast of the optical signals in the waveguide coupling element is substantially zero.

6. The integrated optical circuit according to claim 1, characterized in that the directional coupling element comprises:
   a waveguide combining element, which is suitable to couple optical signals at the input gate to a third strip waveguide and to couple an optical signal from the third strip waveguide to the output gate; and
   a waveguide branching element, which is suitable to couple an optical signal from the third strip waveguide to the first and second optical signal path and to couple optical signals from the first and second optical signal path to the third strip waveguide.

7. The integrated optical circuit according to claim 6, characterized in that the directional coupling element comprises a spatial filter element, which is suitable to emit higher waveguide modes.

8. The integrated optical circuit according to claim 6, characterized in that the spatial filter element is embodied as curve or cross sectional change of the third strip waveguide.

9. The integrated optical circuit according to claim 6, characterized in that the directional coupling element comprises an integrated optical polarization element.

10. The integrated optical circuit according to claim 1, characterized by
    exactly one optical module,
    a light source, which is coupled to the directional coupling element via the input gate, and
    a detector element, which is coupled to the directional coupling element via the output gate and which is suitable to output phase information, which describes a phase relationship between the polarization modes of the optical signals, which are coupled into the first and second strip waveguide by the optical fiber line.

11. The integrated optical circuit according to claim 10, characterized by an evaluation and control unit, which, based on the phase information, is suitable to control the phase modulator device such that the phase between the polarization modes of the optical signals, which are coupled in the first and second strip waveguide by means of the optical fiber line, does not deviate from a predetermined value.

12. The integrated optical circuit according to claim 1, characterized by exactly three or more optical modules.

13. The integrated optical circuit according to claim 12, characterized by
    a light source, which is coupled to the input gates of the optical modules via strip waveguide and waveguide branches, and
    at least three detector elements, which are coupled to the output gates of the optical modules, wherein each detector element is suitable to output phase information, which describes a phase relationship between the polarization modes of the optical fiber line, which is assigned to the respective optical module, in the first and second strip waveguide of the optical signal coupled into the respective optical module.

14. The integrated optical circuit according to claim 12, characterized by an evaluation and control unit, which, based on the phase information, is suitable to control the phase modulator devices in the respective optical modules such that a phase difference between the polarization modes of the optical fiber line, which is assigned to the respective optical module, in the optical signals, which are coupled into the respective first and second strip waveguides, does not deviate from a respective predetermined value.

15. The integrated optical circuit according to claim 10, characterized in that the light source is monolithically integrated in the optical circuit.

16. The integrated optical circuit according to claim 10, characterized in that the evaluation and control unit is monolithically integrated in the optical circuit.

17. A sensor module characterized by an integrated optical circuit according to claim 1, and a thermoelectric element, which is thermally coupled to the integrated optical circuit.

18. A measuring device for measuring current on the basis of the Faraday effect, comprising an integrated optical circuit according to claim 1, or a sensor module according to claim 17 and a magnetic field-sensitive fiber-optical sensor head, which is suitable for coupling to the waveguide coupling element.

19. An integrated optical circuit for measuring current on the basis of the Faraday effect, comprising at least one optical module, which encompasses:
    a first strip waveguide of a semiconductor material;
    a second strip waveguide of the semiconductor material;
    a waveguide coupling element, which is suitable for coupling a first optical signal from the first strip waveguide and a second optical signal from the second strip waveguide to an optical fiber line, wherein the same polarization modes of the first and second optical signal are coupled to different polarization modes of the optical fiber line and optical signals from the optical fiber line are coupled to first and second strip waveguide as a function of the polarization mode,
    wherein the waveguide coupling element comprises a grating integrally formed in the semiconductor material.

20. An integrated optical circuit for measuring current on the basis of the Faraday effect, comprising at least one optical module, which encompasses:
    a first strip waveguide of a semiconductor material;
    a second strip waveguide of the semiconductor material;
    a waveguide coupling element, which is suitable for coupling a first optical signal from the first strip waveguide and a second optical signal from the second strip waveguide to an optical fiber line, wherein the same polarization modes of the first and second optical signal are coupled to different polarization modes of the optical fiber line and optical signals from the optical fiber line are coupled to first and second strip waveguide as a function of the polarization mode;
    a directional coupling element, which is suitable to couple an optical input signal at an input gate to the first and the second strip waveguide and to couple optical signals from the first and second strip waveguide to an output gate;
    a first optical signal path between the directional coupling element and the waveguide coupling element, comprising the first strip waveguide; and
    a second optical signal path between the directional coupling element and the waveguide coupling element, comprising the second strip waveguide, wherein an optical distance of the second optical signal path deviates from that of the first optical signal path.

* * * * *